United States Patent [19]

Huber et al.

[11] Patent Number: 5,328,853
[45] Date of Patent: Jul. 12, 1994

[54] METHOD OF MAKING A PHOTODETECTOR ARRAY HAVING HIGH PIXEL DENSITY

[75] Inventors: Carmen I. Huber, Silver Spring, Md.; Tito E. Huber, Brooklyn, N.Y.; Tak-Kin Chu, Bethesda, Md.; Nicholas Caviris, Rockville, Md.

[73] Assignee: The United States of America as represented by the Secretary of the Navy, Washington, D.C.

[21] Appl. No.: 77,806

[22] Filed: Jun. 18, 1993

[51] Int. Cl.$^5$ .......................................... H01L 31/18
[52] U.S. Cl. ............................................. 437/3; 437/5; 437/185; 437/232; 437/905; 148/DIG. 50; 148/DIG. 107
[58] Field of Search ............... 437/3, 4, 5, 904, 905, 437/906, 927, 232, 185, 248; 148/DIG. 107, DIG. 50

[56] References Cited

U.S. PATENT DOCUMENTS

| | | | |
|---|---|---|---|
| 2,446,237 | 8/1948 | Mueller et al. | 437/232 |
| 2,450,020 | 9/1948 | Richards et al. | 437/232 |
| 2,597,000 | 5/1952 | Hyde | 437/232 |
| 3,773,567 | 11/1973 | Gillespie | 437/232 |
| 4,049,505 | 9/1977 | Chatterji | 437/232 |
| 4,232,440 | 11/1980 | Basteik | 437/906 |
| 5,011,793 | 4/1991 | Obinata | 437/78 |
| 5,156,980 | 10/1992 | Hisa | 437/5 |
| 5,298,432 | 3/1994 | Sayyah | 437/4 |

Primary Examiner—Tom Thomas
Assistant Examiner—Michael Trinh
Attorney, Agent, or Firm—Jacob Shuster

[57] ABSTRACT

Photoconductive semiconductor material is injected into narrow and closely spaced cylindrical channels in an insulating matrix plate to form pixel elements of a high resolution photodetector array. A transparent conductive layer is deposited on one surface of the photoconductor array while light reflecting pads are formed on the elements at the opposite surface. Subsequently, a layer of light modulating material and a transparent conductive layer are deposited on the opposite surface to obtain a high resolution spatial light modulator.

2 Claims, 2 Drawing Sheets

METHOD OF MAKING A PHOTODETECTOR ARRAY HAVING HIGH PIXEL DENSITY

BACKGROUND OF THE INVENTION

This invention relates generally to photosensing arrays embodied in opto-electronic devices, such as spatial light modulators.

Photoconductor arrays utilized as a charge generating component in optically addressed spatial light modulators have relatively small picture elements or pixels, the size and spacing of which is a factor in determining the final spatial resolution of the light modulator output. Current photodetector arrays feature pixels between approximately 5 and 100 microns in size, spaced apart between 5 and 100 microns. Thus, as explained in a related copending application, U.S. Ser. No. 08/059,766, filed May 11, 1993, (the disclosure of which is incorporated herein by reference), improvement in spatial resolution was heretofore limited by a maximum pixel density of approximately 1,000,000 pins per square centimeter.

It is therefore an important object of the present invention to enhance spatial resolution in spatial light modulators or the like by increasing the pixel density of photodetector arrays.

SUMMARY OF THE INVENTION

In accordance with the present invention, a photodetector array is fabricated by injecting molten photoconductive semiconductor material under a hydrostatic penetration pressure into narrow and closely spaced parallel, cylindrical channels formed in an insulating matrix plate. The matrix plate is then cooled to cause the molten semiconductor material to solidify into pins within the channels. The solidified semiconductor pins are then chemically etched at one axial end surface of the matrix plate to form shallow wells within the channels which are subsequently filled with reflecting material forming pixel reflecting pads. A light modulating material is subsequently deposited onto the mirror interface so formed.

The solidified semiconductor material in the channels forms the pins or pixel elements of a high density array converting a write-light beam incident on one surface of the array into electrical fields at the opposite terminal ends of the pins in contact with the light modulating material to effect spatial light modulation of a reflected read-light beam with enhanced resolution.

BRIEF DESCRIPTION OF THE DRAWING FIGURES

Other objects, advantages and novel features of the invention will become apparent from the following detailed description of the invention when considered in conjunction with the accompanying drawing wherein.

DETAILED DESCRIPTION OF THE PREFERRED EMBODIMENT

Figure 1:
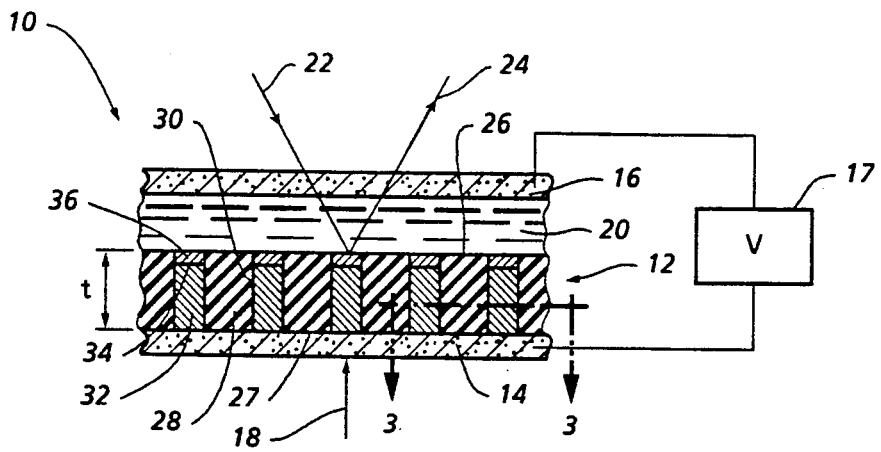
FIG. 1 is a partial side section view through a spatial light modulator constructed in accordance with one embodiment of the invention.

Referring now to the drawing in detail, FIG. 1 illustrates the cross-sectional architecture of an optically addressed spatial light modulator 10, with which the present invention is associated according to one embodiment. The modulator 10 incorporates therein a photodetector array generally referred to by reference numeral 12, directly interfaced with an outer conductive transparent layer 14 on one side, opposite an outer transparent conductive layer 16 having an underlying light modulating layer 20. A constant DC voltage (V) from some source 17 is applied between layers 14 and 16. In the absence of illumination, the electric fields produced by such voltage act on the photoconductor array 12, the material of which has a high resistance in the dark. When an input beam of write-light, denoted by arrow 18, impinges on the photodetector array 12 through layer 14 and is absorbed the resistance of the photoconductor material is lowered. The electric fields from the external source then act on the modulating layer 20 and effect changes in its optical properties. The intensity of a beam of readout light 22 transmitted through layer 16 is thereby modified during passage through the modulating layer 20 to produce an output beam of modulated light 24 reflected from a partially mirrored interface surface 26 between the layer 20 and the photodetector array 12.

Figure 3:
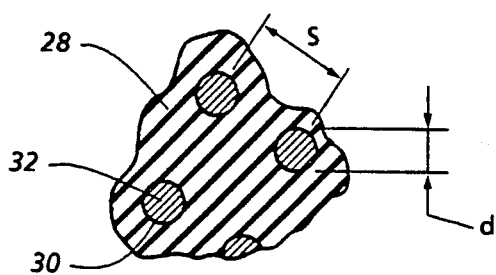
FIG. 3 is an enlarged partial section view taken substantially through a plane indicated by section line 3—3 in FIG. 1.

As shown in FIGS. 1 and 3, the photodetector array according to one embodiment of the invention is formed from an electrically insulating matrix plate 28 made of alumina having a thickness (t), such as 50 microns according to one embodiment. A plurality of cylindrical channels 30 are formed in the matrix plate as shown, in parallel spaced relationship to each other and extending between the interface surface 26 and the opposite plate surface 27. The diameter (d) of such channels is 20 nanometers for example, while the spacing (S) between channels is 30 nanometers to produce a pixel density of $10^{11}$ elements per square centimeter when the channels are occupied by electrically conductive pins 32 made of selenium semiconductor. The pins 32 as pixel elements in such embodiment of the invention occupy 35% of a two square centimeter cross-sectional area of the matrix 28. The visible write-light beam 18 impinging on each pin 32 is thus converted into an electrical signal to create an electric field at the terminal end 34 of the pin.

The spaces in the matrix channels between the interface surface 26 and the terminal ends 34 of the pins 32, are occupied by light reflecting pads 36 to form a mirror from which the read-light beam 22 is reflected as the modulated light beam 24 diagrammed in FIG. 1. The light beams are transmitted to and from the photodetector array 12 through the transparent outer layers 14 and 16 made of indium tin oxide and the light modulating layer 20 formed by a liquid crystal in the illustrated embodiment.

Figure 4:
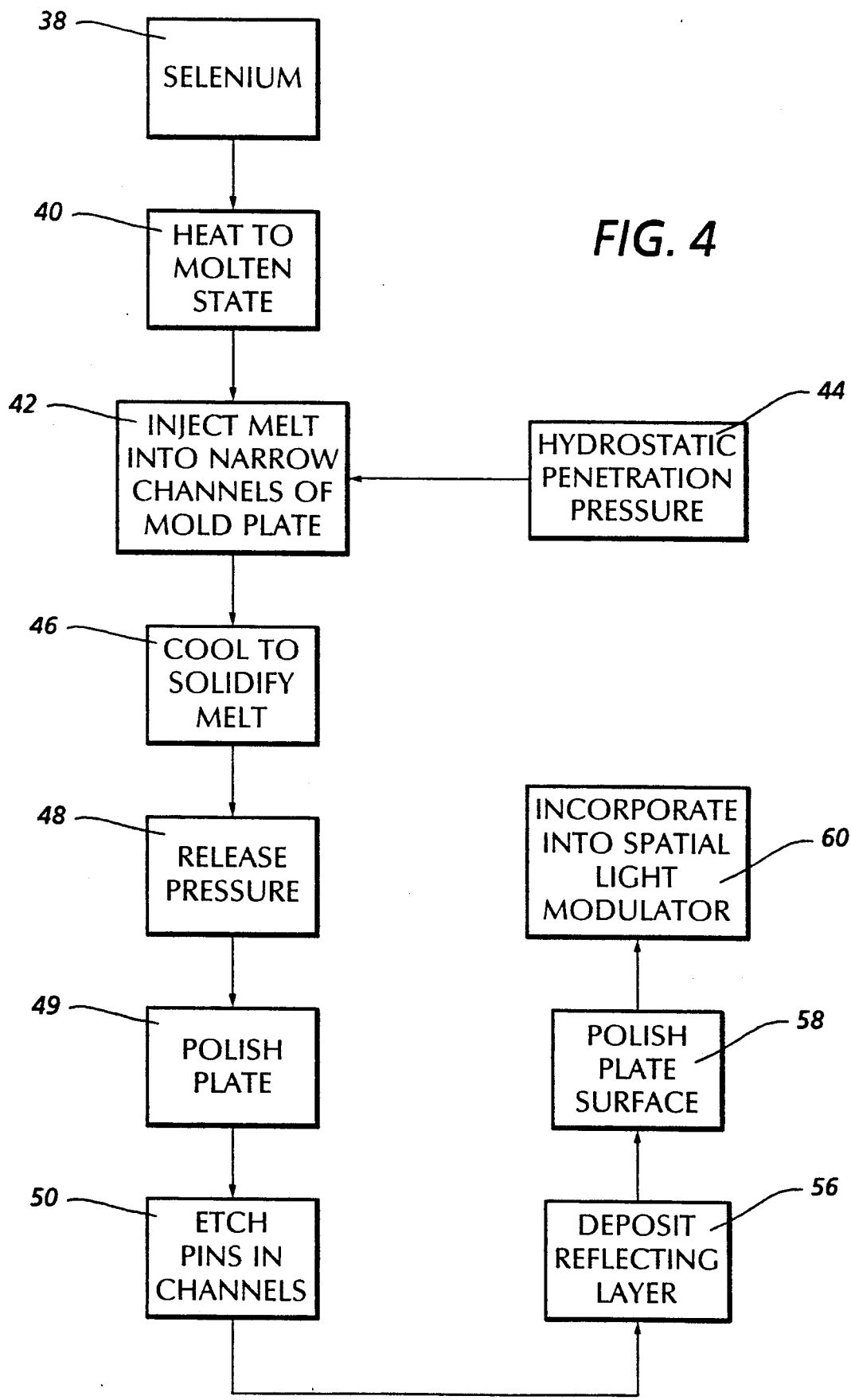
FIG. 4 is a block diagram schematically depicting the fabrication method associated with the present invention.

The geometrical dimensions (d) and (s) of the photodetector array 12 as hereinbefore referred to are made less than the minimum dimensions heretofore available by a factor of up to 250 by means of a fabrication method as diagrammed in FIG. 4. Pursuant to such method, the selenium semiconductor, as denoted by block 38, is heated to a molten state as a first step denoted by block 40 in FIG. 4. The melted selenium is then injected into the narrow channels 30 of the matrix plate 28 as the mold in the next step, denoted by block 42, under a suitable hydrostatic penetration pressure as denoted by block 44. The mold plate 28 is then cooled so that the molten selenium semiconductor in the channels 30 solidifies, as denoted by block 46, after which the injection penetration pressure applied is relieved from the matrix plate and channels as indicated by block 48. The matrix plate is then polished to clean the excess semiconductor material on the outside surfaces, as indicated by block 49.

Figure 2A:
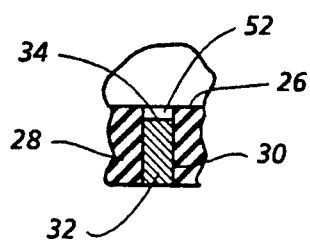
FIG. 2A, 2B and 2C are enlarged partial side section views showing different stages in the formation of the photodetector array embodied in the spatial light modulator illustrated in FIG. 1.
Figure 2B:
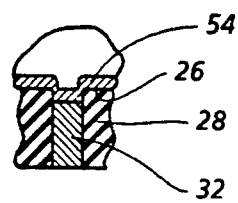
Figure 2C:
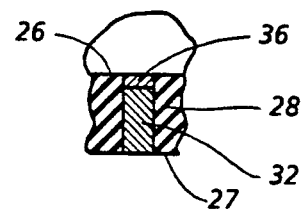

Pursuant to the next fabrication step, the solidified semiconductor in the channels 30 is chemically etched at one end, as denoted by block 50, to form a channel space 52 (as shown in FIG. 2A) between the terminal end 34 of each pin 32 and the plane of the interface surface 26 of the matrix plate 28. A layer of reflecting material 54, such as aluminum or a dielectric reflector, is then deposited onto the matrix plate surface 26, as shown in FIG. 2B and denoted by block 56 in FIG. 4. The reflecting material thus enters and fills the channel spaces 52 as shown in FIG. 2B. Thereafter, the excess reflecting material is removed by polishing the matrix plate, as denoted by block 58, thereby forming the reflecting pads 36 with surfaces in the plane of the mirror interface surface 26 as shown in FIG. 2C. The completed photodetector array 12 may then be incorporated into the spatial light modulator 10, as denoted by block 60, by deposit of the light modulating layer 20 onto the array 12 and the deposit of the outer transparent conductive layers 14 and 16 onto the photoconductor array and the modulating layer 20, respectively.

Numerous other modifications and variations of the present invention are possible in light of the foregoing teachings. It is therefore to be understood that within the scope of the appended claims the invention may be practiced otherwise than as specifically described.

What is claimed is:

1. A method of making a photodetector device which includes an electrically insulating matrix having a plurality of pins made of a photoconducting semiconductor embedded in channels formed in the matrix to provide a pixel density substantially exceeding 1,000,000 per square centimeter, comprising the steps of: heating the photoconducting semiconductor to a molten state; injecting said photoconducting semiconductor in the molten state into the channels of the matrix; cooling the matrix to solidify the injected photoconducting semiconductor into the pins; chemically etching the pins at an interface surface of the matrix to form spaces in the channels between the pins and said interface surface; and filling said spaces in the channels with light reflecting material.

2. The method as defined in claim 1 wherein said step of filling the spaces comprises: depositing a layer of the reflecting material over the interface surface of the matrix causing the reflecting material to enter into said spaces in the channels; and polishing the interface surface to remove an excess of the reflecting material deposited thereon leaving the spaces in the channels filled with the reflecting material as reflecting pads in contact with the pins.

* * * * *